United States Patent
Imai et al.

(10) Patent No.: US 10,629,786 B2
(45) Date of Patent: Apr. 21, 2020

(54) LIGHT EMITTING DEVICE AND MANUFACTURING METHOD THEREOF

(71) Applicants: Citizen Electronics Co., Ltd., Fujiyoshida-shi, Yamanashi (JP); Citizen Watch Co., Ltd., Nishitokyo-shi, Tokyo (JP)

(72) Inventors: Sadato Imai, Fujiyoshida (JP); Masahide Watanabe, Fujiyoshida (JP); Hirohiko Ishii, Fujiyoshida (JP); Koki Hirasawa, Fujiyoshida (JP)

(73) Assignees: CITIZEN ELECTRONICS CO., LTD., Fujiyoshida-Shi, Yamanshi (JP); CITIZEN WATCH CO., LTD., Nishitokyo-Shi, Tokyo (JP)

(*) Notice: Subject to any disclaimer, the term of this patent is extended or adjusted under 35 U.S.C. 154(b) by 1 day.

(21) Appl. No.: 15/577,714

(22) PCT Filed: May 30, 2016

(86) PCT No.: PCT/JP2016/065931
§ 371 (c)(1),
(2) Date: Nov. 28, 2017

(87) PCT Pub. No.: WO2016/194876
PCT Pub. Date: Dec. 8, 2016

(65) Prior Publication Data
US 2018/0158998 A1    Jun. 7, 2018

(30) Foreign Application Priority Data

May 29, 2015    (JP) ................................ 2015-110489
Feb. 9, 2016    (WO) .................. PCT/JP2016/053839

(51) Int. Cl.
*H01L 33/50*    (2010.01)
*H01L 33/58*    (2010.01)
(Continued)

(52) U.S. Cl.
CPC ........ *H01L 33/507* (2013.01); *H01L 25/0753* (2013.01); *H01L 33/48* (2013.01);
(Continued)

(58) Field of Classification Search
None
See application file for complete search history.

(56) References Cited

U.S. PATENT DOCUMENTS 5,593,913 A * 1/1997 Aoki ................... G02B 3/0018
257/E27.133
8,052,307 B2 11/2011 Bak et al.
(Continued)

FOREIGN PATENT DOCUMENTS

JP    2006-005290 A    1/2006
JP    2009123758 A    6/2009
(Continued)

OTHER PUBLICATIONS

International Search Report for related PCT application No. PCT/JP2016/053839 dated Mar. 22, 2016, 7 pages. English translation provided.
(Continued)

*Primary Examiner* — Herve-Louis Y Assouman
*Assistant Examiner* — Herve Assouman
(74) *Attorney, Agent, or Firm* — Procopio, Cory, Hargreaves & Savitch LLP

(57) ABSTRACT

A light-emitting device and a manufacturing method thereof are provided, which device yields light exhibiting an actual hue with a deviation reduced as much as possible from a designed hue value, wherein the light is a mixture of light emitted from densely-mounted light-emitting elements and excited light from a phosphor contained in a resin sealing the light-emitting elements. The light-emitting device includes a board, light-emitting elements mounted densely on the
(Continued)

board so that light-emitting surfaces thereof face opposite to the board, and a seal resin containing a plurality of different phosphors and covering all of the light-emitting elements, wherein the phosphors are excited by light from the light-emitting elements and deposited on upper surfaces of the light-emitting elements. A space between adjacent light-emitting elements has a length of 5 μm or more and 120% or less of a median diameter D50 of a phosphor which has the largest average particle size of the phosphors.

10 Claims, 12 Drawing Sheets

(51) Int. Cl.
  H01L 33/56    (2010.01)
  H01L 33/60    (2010.01)
  H01L 33/48    (2010.01)
  H01L 25/075   (2006.01)
  H01L 23/60    (2006.01)
  H01L 25/16    (2006.01)
  H01L 27/02    (2006.01)
  H01L 29/866   (2006.01)
(52) U.S. Cl.
  CPC .............. H01L 33/50 (2013.01); H01L 33/56 (2013.01); H01L 33/58 (2013.01); H01L 23/60 (2013.01); H01L 25/167 (2013.01); H01L 27/0248 (2013.01); H01L 29/866 (2013.01); H01L 33/508 (2013.01); H01L 33/60 (2013.01); H01L 2224/48137 (2013.01); H01L 2924/181 (2013.01); H01L 2933/005 (2013.01); H01L 2933/0041 (2013.01)

(56) References Cited

U.S. PATENT DOCUMENTS

| | | | |
|---|---|---|---|
| 8,858,022 B2 | 10/2014 | Jiang et al. | |
| 2002/0171911 A1* | 11/2002 | Maegawa | H01L 33/50 359/308 |
| 2006/0001361 A1 | 1/2006 | Imai et al. | |
| 2007/0262339 A1* | 11/2007 | Hussell | C09K 11/7731 257/99 |
| 2008/0128732 A1* | 6/2008 | Haruna | H01L 33/44 257/98 |
| 2008/0290351 A1* | 11/2008 | Ajiki | H01L 25/0753 257/88 |
| 2009/0302337 A1* | 12/2009 | Chang | H01L 25/0753 257/98 |
| 2011/0180817 A1* | 7/2011 | Ishizaki | F21V 3/00 257/88 |
| 2012/0146077 A1* | 6/2012 | Nakatsu | H01L 33/486 257/98 |
| 2012/0161184 A1* | 6/2012 | Ubahara | H01L 27/156 257/98 |
| 2013/0020590 A1 | 1/2013 | Lin et al. | |
| 2013/0163244 A1* | 6/2013 | Suzuki | F21V 21/00 362/235 |
| 2013/0207130 A1* | 8/2013 | Reiherzer | H01L 25/0753 257/88 |
| 2014/0203305 A1 | 7/2014 | Kawano et al. | |
| 2015/0207045 A1* | 7/2015 | Wada | H01L 33/505 257/88 |

FOREIGN PATENT DOCUMENTS

| | | |
|---|---|---|
| JP | 2010-170945 A | 9/2010 |
| JP | 2012-044048 A | 3/2012 |
| JP | 2013-153134 A | 8/2013 |
| JP | 2014-027156 A | 2/2014 |
| JP | 2014138185 A | 7/2014 |
| WO | 2012-091008 A1 | 7/2012 |

OTHER PUBLICATIONS

Written Opinion for related PCT application No. PCT/JP2016/053839 dated Mar. 22, 2016, 9 pages. English translation provided.
International Search Report for related PCT application No. PCT/JP2016/065931 dated Jun. 28, 2016, 5 pages. English translation provided.
Written Opinion for related PCT application No. PCT/JP2016/065931 dated Jun. 28, 2016, 9 pages. English translation provided.
Final Notification of Reasons for related JP App No. 2017-521938 dated Jan. 7, 2020, 8 pgs.

* cited by examiner

LIGHT EMITTING DEVICE AND MANUFACTURING METHOD THEREOF

TECHNICAL FIELD

The present invention relates to a light-emitting device and a manufacturing method thereof.

BACKGROUND ART

There are known COB (Chip On Board) light-emitting devices provided with light-emitting elements such as LED (light-emitting diode) elements mounted on a general purpose board such as a ceramic board and a metal board. In such light-emitting devices, LED elements emitting light such as blue light are sealed with a resin containing a phosphor, which is excited by the light from the LED elements to yield light that is mixed therewith to provide light such as white light according to an application.

For example, Patent Literature 1 describes a light-emitting diode provided with a heat dissipation support with high thermal conductivity having a mount surface for die bonding, a circuit board which is placed on the heat dissipation support and has not only a hole for exposing a region of the mount surface but also overhang regions overhanging the perimeter edges of the heat dissipation support, a light-emitting element mounted on the mount surface inside the hole, and a light-transmissive resin body for sealing the upper part of the light-emitting element, wherein through-holes electrically connected to the light-emitting element are formed in the perimeter edges of the overhang regions, which through-holes are provided with external connection electrodes on the upper and lower surfaces thereof.

Further, Patent Literature 2 describes an LED package provided with a cavity including a recessed region formed therein, a protruding heat slug (pedestal) attached to the cavity in such a way as to penetrate the bottom of the recessed region, a submount board mounted on the heat slag, a plurality of LED chips disposed on the submount board, a lead frame electrically connected to each of the LED chips, a phosphor layer embedding each of the LED chips, and a lens formed of a silicone resin filled in the recessed region.

When such light-emitting devices are manufactured, the phosphor dispersed in the resin is settled before the resin is cured, in order to, for example, reduce the variation of chromaticity. For example, Patent Literature 3 describes a production method of a light-emitting element package including the steps of forming a repellent agent pattern on a board, mounting an LED chip inside the repellent agent pattern on the board, applying a seal resin containing a phosphor kneaded therewith to the inside of the repellent agent pattern, and settling the phosphor in the seal resin in a windless condition.

CITATION LIST

Patent Literature

Patent Literature 1: Japanese Unexamined Patent Publication (Kokai) No. 2006-005290
Patent Literature 2: Japanese Unexamined Patent Publication (Kokai) No. 2010-170945
Patent Literature 3: Japanese Unexamined Patent Publication (Kokai) No. 2012-044048

SUMMARY OF INVENTION

When a light-emitting device is surmounted by an optical element, such as a lens, to condense emitted light, the emission region of the light-emitting device is desirably as small as possible in order to improve its light condensation property. However, when the emission region is achieved by using only one light-emitting element, a large element is necessarily used to secure desired light emission intensity, leading to disadvantages such as the elevation of manufacturing costs and non-uniform electrical current supply to the light-emitting element, which worsens the light emission efficiency of the element. Therefore, a solution for such problems may be to mount a plurality of light-emitting elements densely, to achieve a compact emission region while securing desired light emission intensity.

However, in regard to light-emitting devices provided with a plurality of light-emitting elements mounted on a board and sealed with a resin containing a phosphor, excited light from which is mixed with light from the light-emitting elements and yields a desired light such as white light, the actual hue of the emitted light may be different from a desired hue thereof. This is because the traveling distance of light in the phosphor layer varies depending on what surface of the light-emitting elements emits the light, owing to the presence of the phosphor also in portions of the seal resin which portions fill the space among the light-emitting elements, since the light-emitting elements are mounted at a certain extent of space among each other in order to prevent short. The traveling distance of light in the phosphor layer varies depending on the position and direction of the emission from the light-emitting elements, thereby causing the intensity variation of light having a color corresponding to the phosphor, resulting in difficulty in adjusting the actual hue of the emitted light to a designed hue value.

Therefore, an object of the present invention is to provide a light-emitting device and a manufacturing method thereof, which device yields light exhibiting an actual hue with a deviation reduced as much as possible from a designed hue value, wherein the light is a mixture of light emitted from a plurality of light-emitting elements mounted densely and excited light from a phosphor contained in a resin sealing the light-emitting elements.

Provided is a light-emitting device including a board, a plurality of light-emitting elements mounted densely on the board, and a seal resin containing a phosphor and covering all of the plurality of light-emitting elements, wherein the plurality of light-emitting elements is mounted on the board so that a space between adjacent light-emitting elements has a length of 5 μm or more and 120% or less of an average particle size of the phosphor.

Further, provided is a light-emitting device including a board, a plurality of light-emitting elements mounted densely on the board so that light-emitting surfaces thereof face opposite to the board, and a seal resin containing a plurality of different phosphors and covering all of the plurality of light-emitting elements, wherein the plurality of different phosphors is excited by light from the plurality of light-emitting elements and deposited on upper surfaces of the plurality of light-emitting elements, wherein a space between adjacent light-emitting elements has a length of 5 μm or more and 120% or less of a median diameter D50 of a phosphor which has the largest average particle size of the plurality of different phosphors.

Preferably, in the above light-emitting device, the median diameter D50 is 20 μm or more and 25 μm or less.

Preferably, the above light-emitting device further includes an optical element mounted on the board so as to cover the seal resin.

Further, provided is a manufacturing method of a light-emitting device, including the steps of mounting a plurality of light-emitting elements densely on a board, and sealing all of the plurality of light-emitting elements with a seal resin containing a phosphor, wherein in the step of mounting, the plurality of light-emitting elements is mounted on the board so that a space between adjacent light-emitting elements has a length of 5 μm or more and 120% or less of an average particle size of the phosphor.

Further, provided is a manufacturing method of a light-emitting device, including the steps of mounting a plurality of light-emitting elements densely on a board so that light-emitting surfaces thereof face opposite to the board, sealing all of the plurality of light-emitting elements with a seal resin containing a plurality of different phosphors excited by light from the plurality of light-emitting elements, and curing the seal resin after the plurality of different phosphors naturally settles out in the seal resin and is deposited on upper surfaces of the plurality of light-emitting elements, wherein in the step of mounting, the plurality of light-emitting elements is mounted so that a space between adjacent light-emitting elements has a length of 5 μm or more and 120% or less of a median diameter D50 of a phosphor which has the largest average particle size of the plurality of different phosphors.

According to the above light-emitting device and manufacturing method thereof, it is possible to yield light exhibiting an actual hue with a deviation reduced as much as possible from a designed hue value, wherein the light is a mixture of light emitted from a plurality of light-emitting elements mounted densely and excited light from a phosphor contained in a resin sealing the light-emitting elements.

DESCRIPTION OF EMBODIMENTS

Hereinafter, with reference to the accompanying drawings, a light-emitting device and a manufacturing method thereof will be explained in detail. However, it should be noted that the present invention is not limited to the drawings or the embodiments described below.

Figure 1:
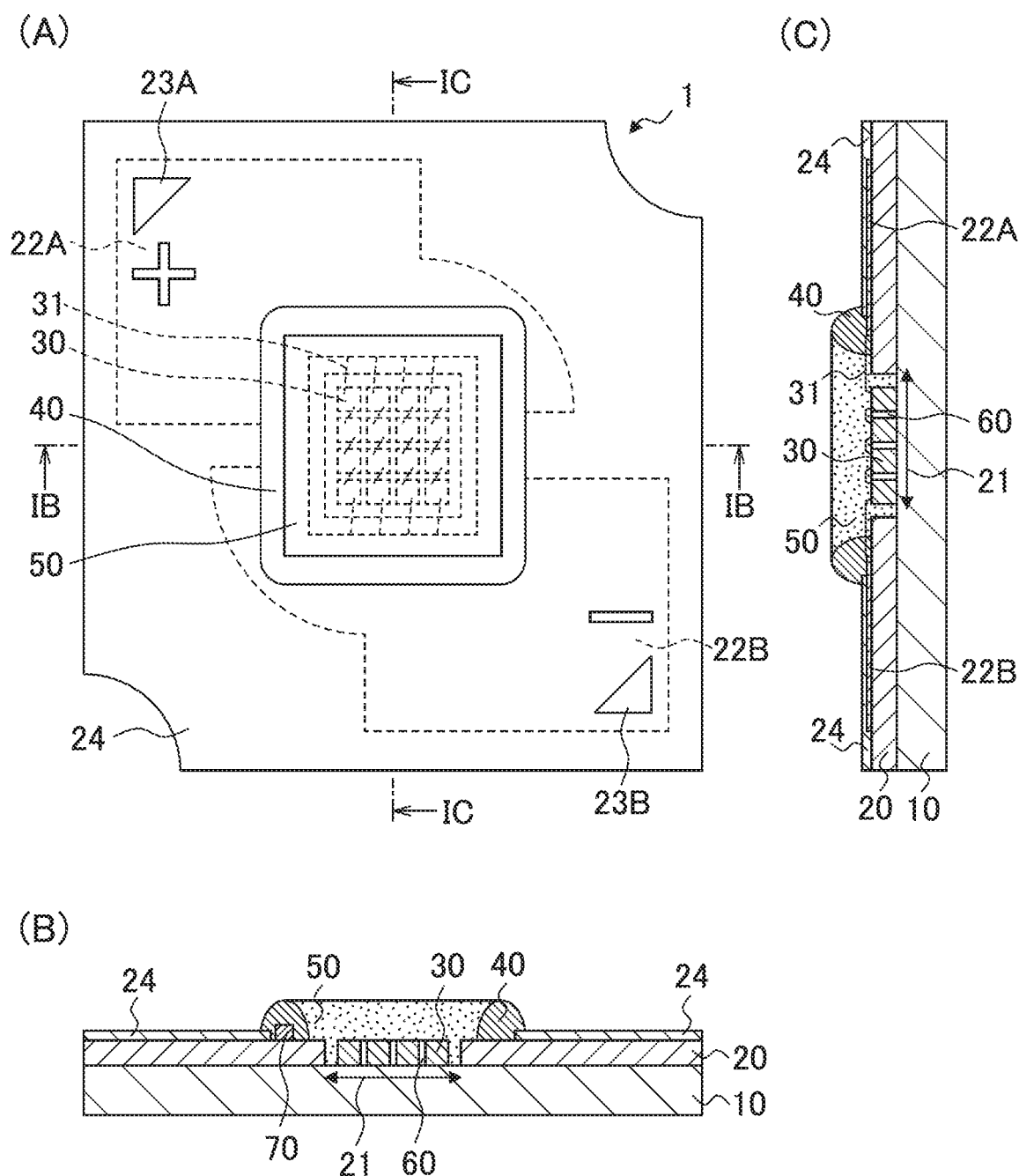
FIGS. 1(A) to (C) are a top view and cross-sectional views of a light-emitting device 1.

FIG. 1(A) to FIG. 1(C) are a top view and cross-sectional views of a light-emitting device 1. FIG. 1(A) is a top view of the light-emitting device 1 as a completed product, FIG. 1(B) is a cross-sectional view along the line IB-IB in FIG. 1(A), and FIG. 1(C) is a cross-sectional view along the line IC-IC in FIG. 1(A). The light-emitting device 1 includes LED elements as light-emitting elements, and is used for various illumination apparatuses such as LEDs for illumination and LED light bulbs. The light-emitting device 1 is provided with a mount board 10, a circuit board 20, LED elements 30, a resin frame 40, a seal resin 50, and a Zener diode 70, as major components.

The mount board 10 is, for example, an almost square-shaped metal board, and includes, in the central region of the upper surface thereof, a mount region on which the LED element 30 are mounted. The mount board 10 is composed of, for example, aluminum excellent in thermal resistance and heat dissipativity, so that it also functions as a heat dissipation board for dissipating heat generated by the LED elements 30 and by a particulate phosphor described later. However, the material for the mount board 10 may be another metal such as copper, as long as it is excellent in thermal resistance and heat dissipativity.

Figure 5:
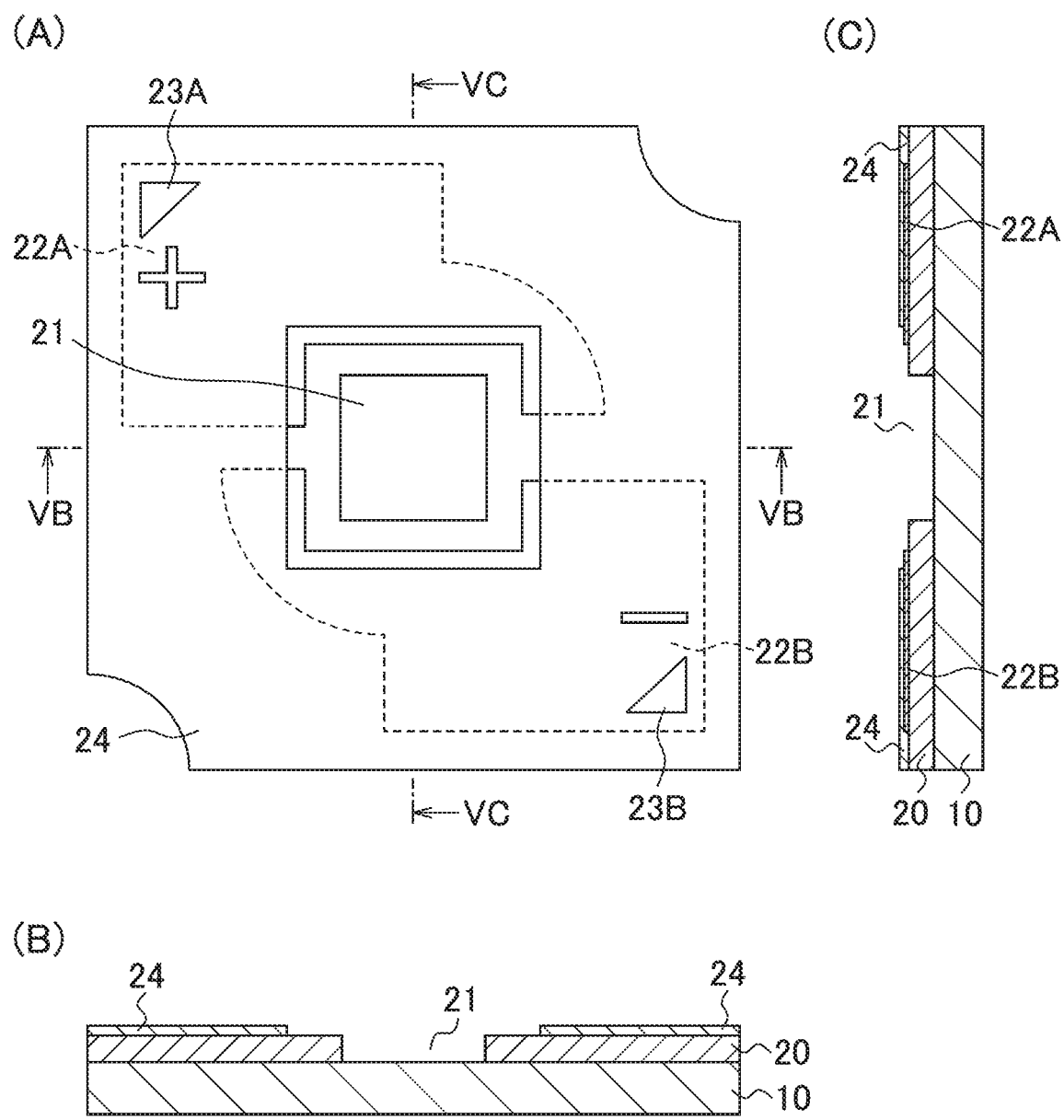
FIGS. 5(A) to (C) are a top view and cross-sectional views depicting a manufacturing step of the light-emitting device 1.
Figure 6:
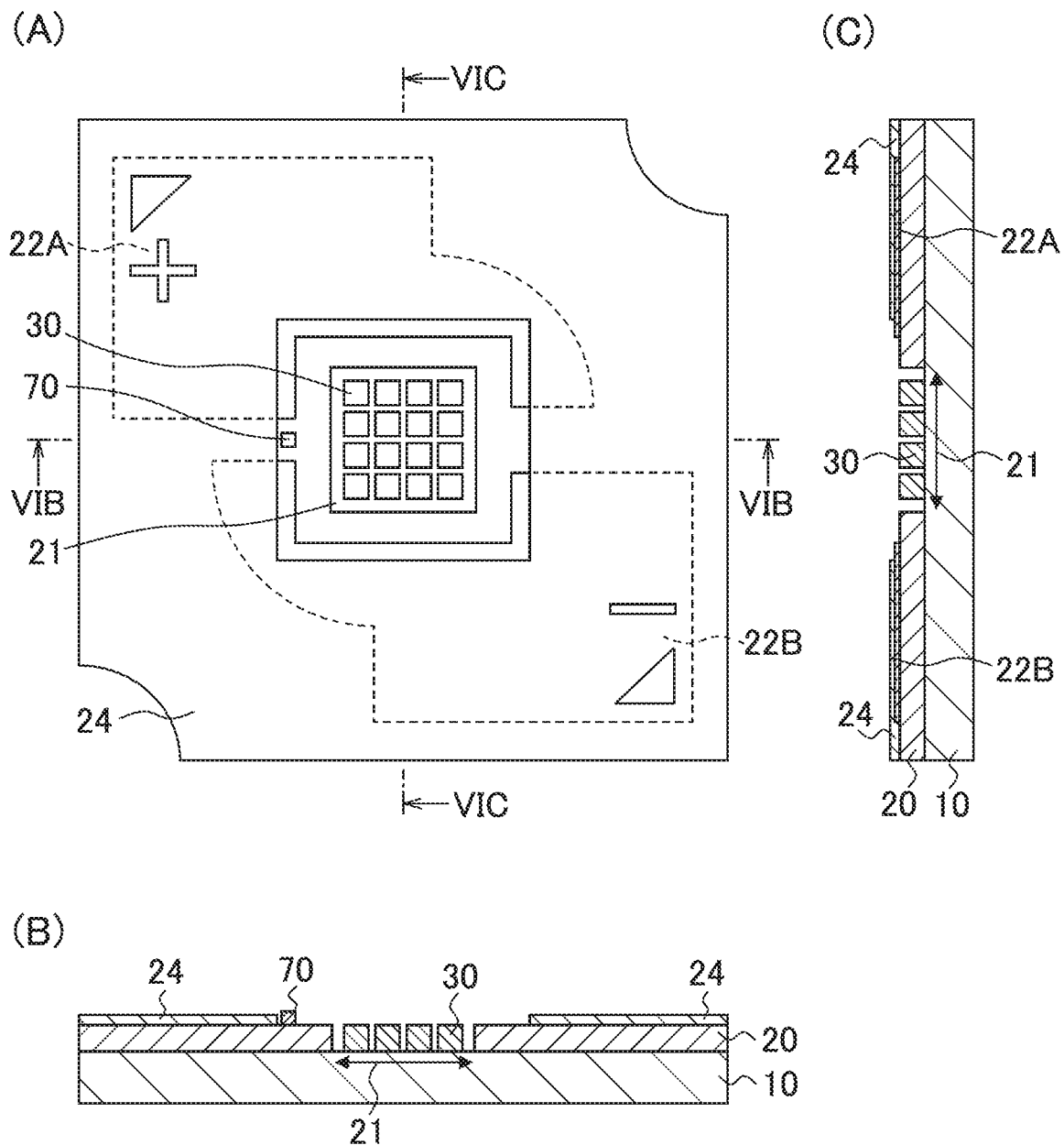
FIGS. 6(A) to (C) are a top view and cross-sectional views depicting a manufacturing step of the light-emitting device 1.

The circuit board 20 is, for example, of an almost square shape of the same size as that of the mount board 10, and provided with a rectangular opening 21 in its central region. The circuit board 20 is attached to and fixed on the mount board 10, for example, by an adhesion sheet on the lower surface of the circuit board. The circuit board 20 is provided with a conductive pattern 22A for a '+' electrode and a conductive pattern 22B for a '−' electrode, which are formed on the upper surface thereof. Further, the circuit board 20 is provided with connection electrodes 23A and 23B for connecting the light-emitting device 1 to an external power supply, which electrodes are formed at two corners located diagonally on the upper surface of the circuit board 20. The connection electrode 23A is the '+' electrode, and the connection electrode 23B is the '−' electrode, which are connected to and supplied with voltage from the external power supply, to drive the light-emitting device 1 to emit light. Still further, the circuit board 20 is provided with a white resist 24 which is formed on the upper surface thereof and covers the conductive patterns 22A and 22B except for the region on the surface neighboring and enclosing the perimeter of the opening 21 and the regions on the connection electrodes 23A and 23B (see FIG. 5(A) described later).

The LED elements 30 are an example of the light-emitting elements, and are, for example, blue LEDs which emit blue light having a wavelength band within the range from about 450 to 460 nm. The width of each LED element 30 is, for example, about 500 to 600 μm. In the light-emitting device 1, a plurality of LED elements 30 is mounted in a lattice-like arrangement on the central region of the mount board 10 exposed in the opening 21 of the circuit board 20. FIG. 1(A) illustrates, in particular, an example in which sixteen LED elements 30 are mounted. The LED elements 30 are fixed to the upper surface of the mount board 10, for example, by a transparent electrically insulative adhesive so that light-emitting surfaces thereof face upward (the side opposite to the mount board 10). The LED elements 30 are provided with a pair of element electrodes on the upper surfaces thereof, and the respective element electrodes of adjacent LED elements 30 are electrically connected to each other by wires 31 as depicted in FIG. 1(A). Wires 31 led out of outermost LED elements 30 located adjacent to the perimeter of the opening 21 are connected to the conductive patterns 22A and 22B of the circuit board 20. Thus, the respective LED elements 30 are supplied with electrical current via the wires 31.

The resin frame 40 is an almost rectangular frame body composed of, for example, a white resin and fitted to the size of the opening 21 of the circuit board 20, and is fixed to a region on the upper surface of the circuit board 20, the region neighboring and enclosing the perimeter of the opening 21. The resin frame 40 is a dam member for preventing the outflow of the seal resin 50, and reflects light emitted laterally from the LED elements 30 in the upward direction with respect to the light-emitting device 1 (the direction opposite to the mount board 10 with respect to the LED elements 30).

In the light-emitting device 1, the mount region on the mount board 10, the opening 21 of the circuit board 20, and the resin frame 40 are rectangular, but these may have another shape such as a circular shape.

The seal resin 50 is injected into the opening 21 to cover exposed parts of the LED elements 30 (for example, the upper surfaces of the LED elements 30 and the side surfaces of the outermost LED elements 30, which side surfaces are adjacent to the side of the resin frame 40). Thus, the seal resin 50 covers and protects (seals) all of the LED elements 30 and the wires 31 together. For example, as the seal resin 50, a colorless and transparent resin such as silicone and epoxy resins, and in particular, a resin with thermal resistance of about 250° C. may be used.

The seal resin 50 contains a phosphor such as a yellow phosphor (phosphor 51 in FIG. 2 described later) mixed and dispersed therein. The yellow phosphor is a particulate phosphor material, such as YAG (yttrium aluminum garnet), which absorbs blue light emitted by the LED elements 30 and converts the wavelength thereof into that of yellow light. The light-emitting device 1 mixes blue light from the LED elements 30 which are blue LEDs and yellow light yielded through the excitation of the yellow phosphor, and emits the resultant white light.

Alternatively, the seal resin 50 may contain, for example, a plurality of different phosphors such as green and red phosphors. The green phosphor is a particulate phosphor material such as $(BaSr)_2SiO_4:Eu^2$, which absorbs blue light emitted by the LED elements 30 and converts the wavelength thereof into that of green light. The red phosphor is a particulate phosphor material, such as $CaAlSiN_3:Eu^{2+}$, which absorbs blue light emitted by the LED elements 30 and converts the wavelength thereof into that of red light. In this case, the light-emitting device 1 mixes blue light from the LED elements 30 which are blue LEDs and green and red light yielded through the excitation of the green and red phosphors, respectively, and emits the resultant white light.

The phosphor in the seal resin 50 naturally settles out, and is deposited on the upper surfaces of the LED elements 30 and the upper surface of the mount board 10 around the LED elements 30. In other words, the seal resin 50 contains the phosphor, which is excited by light from the LED elements 30, so that the concentration thereof increases toward the lower end of the layer of the seal resin 50. In the light-emitting device 1, since the phosphor in the seal resin 50 settles out on the side close to the mount board 10, heat generated by the LED elements 30 and the phosphor easily escapes to the outside of the device through the mount board 10. Therefore, a decrease in the light emission intensity of the LED elements 30 owing to heat can be prevented, which is advantageous for improving the light emission intensity.

Figure 7:
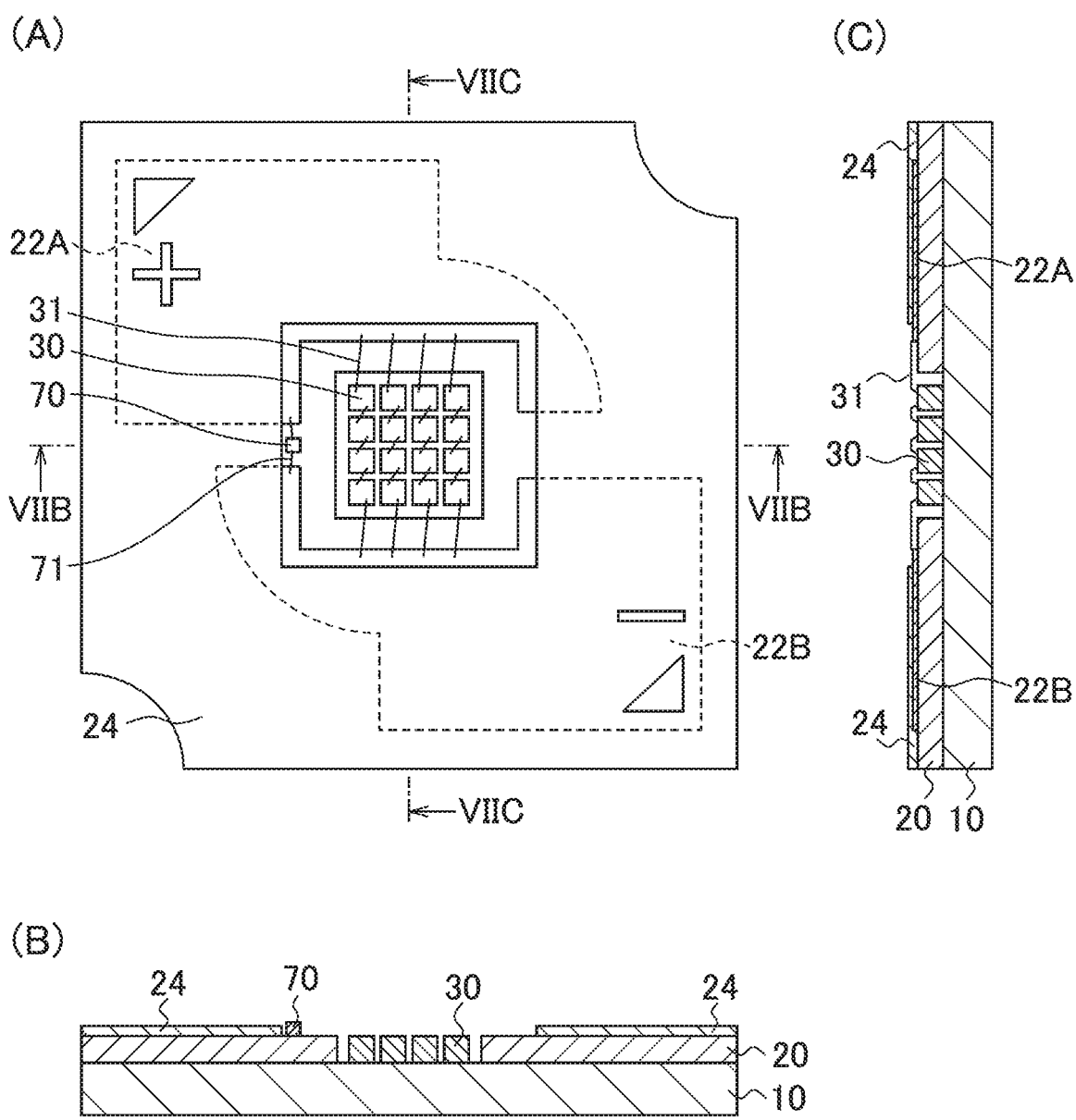
FIGS. 7(A) to (C) are a top view and cross-sectional views depicting a manufacturing step of the light-emitting device 1.
Figure 8:
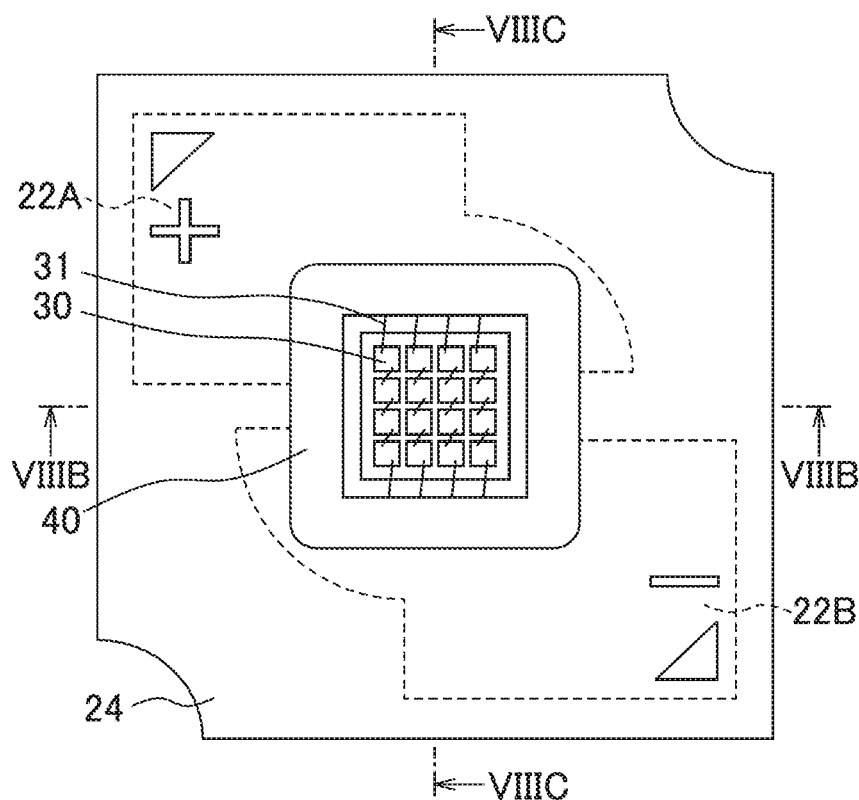
FIGS. 8(A) to (C) are a top view and cross-sectional views depicting a manufacturing step of the light-emitting device 1.
Figure 8:
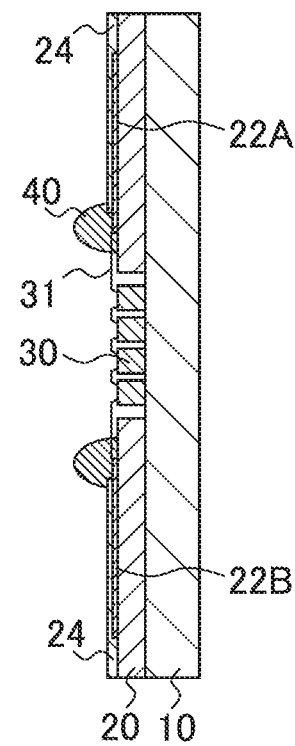
Figure 8:
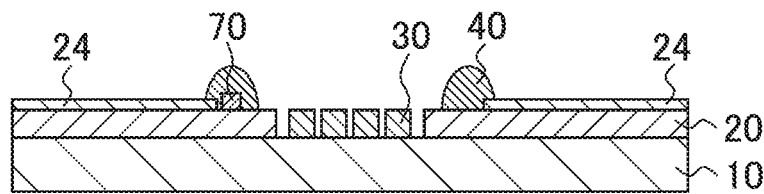

The Zener diode 70 is provided on the circuit board 20 in order to prevent the LED elements 30 from being broken owing to, for example, static electricity. The Zener diode 70 is connected to the conductive patterns 22A and 22B in parallel with the LED elements 30 (see FIG. 7(A) described later), and protects the LED elements 30 by bypassing electrical current caused by voltage inversely applied to the LED elements 30.

In the light-emitting device 1, the plurality of LED elements 30 is mounted densely on the mount board 10 so that the space between adjacent LED elements 30 has a length of 5 μm or more and 120% or less of the average particle size of the phosphor. This average particle size refers to a median diameter, for example, median diameter D50. The particle size of a particulate phosphor has a distribution over a certain range. The median diameter D50 refers to a diameter at which the particle size distribution of certain particles can be divided into two halves, which are a region of a larger particle size and a region of a smaller particle size, each having the same number of particles. As a phosphor, one having an average particle size of 20 μm to 25 μm is widely used, and a phosphor having a larger particle size leads to higher light emission efficiency and brighter emitted light. Thus, in the light-emitting device 1, a phosphor whose average particle size falls within that range may be used as the phosphor contained in the seal resin 50. In this case, 120% of the average particle size is about 25 μm to 30 μm. In the light-emitting device 1, for example, a phosphor having a median diameter D50 of 25 μm is used, and the plurality of LED elements 30 is mounted at a space of 30 μm.

When the seal resin 50 contains a plurality of different phosphors, the plurality of LED elements 30 is mounted so that the space between adjacent LED elements 30 has a length of 5 μm or more and 120% or less of the median diameter D50 of a phosphor which has the largest average particle size (median diameter D50) of the plurality of different phosphors. When a plurality of different phosphors is used, the space between the LED elements 30 may be 30 μm or more, and preferably 60 μm or less at most. Further, when a plurality of different phosphors is used, a phosphor having an average particle size of 20 μm or more and a phosphor having an average particle size of 20 μm or less may be used together. For example, the seal resin 50 may contain a yellow phosphor having an average particle size of 25 μm, a green phosphor having an average particle size of 25 μm, and a red phosphor having an average particle size of 15 μm.

Figure 2:
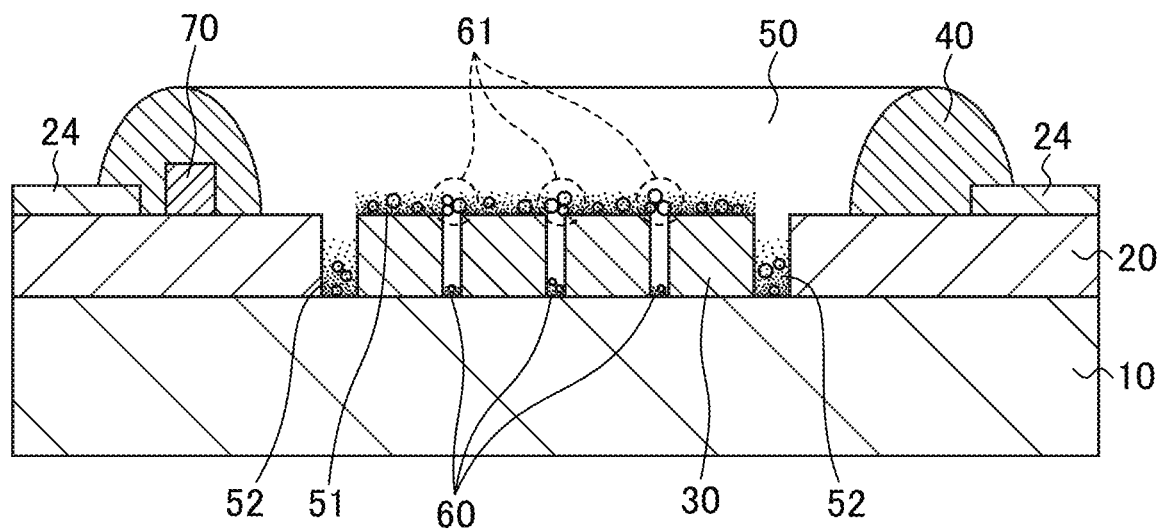
FIG. 2 is an enlarged cross-sectional view of the light-emitting device 1.

FIG. 2 is an enlarged cross-sectional view of the light-emitting device 1. FIG. 2 depicts an enlarged region near the LED elements 30 in FIG. 1(B). FIG. 2 also depicts the phosphor 51 contained in the seal resin 50. The reference numeral 60 indicates the space from the lower to upper end of each LED element 30 among the LED elements 30. This space is hereinafter referred to as "inter-element regions 60." The phosphor 51 is deposited on the upper surfaces of the LED elements 30, just above the inter-element regions 60, and on the upper surface of the mount board 10 in a peripheral region 52 between the inner wall of the opening 21 and the outermost LED elements 30 adjacent to the perimeter of the opening.

In the light-emitting device 1, since the space between the LED elements 30 is slightly wider than the average particle size of the phosphor 51, some of the tiny particles of the phosphor invade the inter-element regions 60. However, since the space between the LED elements 30 is set at 120% or less of the average particle size of the phosphor 51, the upper ends of the inter-element regions 60 are blocked and clogged with large particles of the phosphor as indicated by the reference numeral 61 in FIG. 2. The same is true when the seal resin 50 contains a plurality of different phosphors whose average particle sizes are different from each other. The seal resin 50 may invade the inter-element regions 60, and bubbles may remain in the inter-element regions 60; however, substantially no phosphor 51 invades the inter-element regions 60 owing to the upper ends thereof being blocked. Therefore, the phosphor 51 remains above the upper surfaces of the LED elements 30.

If the mount space among the LED elements 30 were sufficiently wide, allowing the phosphor 51 to invade the inter-element regions 60 with a concentration equal to that in the seal resin 50 above the LED elements 30, light emitted from the side surfaces of the LED elements 30 would exit outwardly from the light-emitting device after traveling a longer path in the layer of the phosphor 51 which is a yellow phosphor, than light emitted from the upper surfaces thereof, resulting in a stronger intensity of the yellow light. In other words, the intensity of the yellow light varies depending on the position and direction of emission from the LED elements 30, resulting in a deviation of the hue of the emitted light from its designed hue value.

However, in the light-emitting device 1, only particles having a small particle size out of the particles of the phosphor 51 invade the inter-element regions 60, and the concentration of the phosphor 51 in the inter-element regions 60 is lower than that in the seal resin 50 above the LED elements 30. Therefore, the light emission of the phosphor 51 in the inter-element regions 60 is much weaker than that of the phosphor 51 above the LED elements 30, light emitted from the side surfaces of the LED elements 30 hardly undergo change in its hue until it reaches a level higher than the LED elements 30 after passing through the inter-element regions 60. In other words, in the light-emitting device 1, since light emitted from the side surfaces of the LED elements 30 and that from the upper surfaces thereof travel the same distance in the layer of the phosphor 51 above the LED elements 30 before they are emitted outwardly, the distance in the phosphor layer which is traveled by emitted light is kept constant regardless of the position and direction of emission from the LED elements 30. Therefore, in the light-emitting device 1, light emitted laterally from the LED elements 30 is not an origin of the variation of the hue, is also unlikely to cause a deviation of the actual hue of the emitted light from a desired hue thereof, and thereby results in emitted light with uniform chromaticity.

Further, in the light-emitting device 1, the LED elements 30 are mounted so that the light-emitting surfaces thereof are placed on the upper side, and thus, even if part of the phosphor is deposited in the inter-element regions 60, such phosphor particles are relatively away from the light-emitting surfaces of the LED elements 30. Therefore, even if the phosphor which has invaded the inter-element regions 60 is excited, it does not affect the variation of the hue (color irregularities) of the emitted light.

FIG. 2 depicts a large number of particles of the phosphor 51 which has invaded the peripheral region 52 between the inner wall of the opening 21 and the outermost LED elements 30 adjacent to the perimeter of the opening. A large number of particles of the phosphor 51 may invade the peripheral region 52, unlike the inter-element regions 60, as long as the phosphor 51 is settled and placed in such a way that the thickness of the phosphor 51 in the peripheral region 52 is comparable to that on the upper side of the LED elements 30. However, it is preferable that the width of the peripheral region 52 be narrower than the width of each LED element 30, and wider than the height of the circuit board 20. For example, when the width of each LED element 30 is about 500 to 600 µm and the height of the circuit board 20 is about 100 µm, it is preferable that the width of the peripheral region 52 be about 200 to 400 µm. It is also preferable that the height of the circuit board 20 be the same as or smaller by about 10% than that of the LED elements 30.

Alternatively, in order to eliminate the variation of the hue by making emitted light travel a constant distance in the phosphor layer, the peripheral region 52 may be filled with a transparent or white resin which contains no phosphor.

Figure 3:
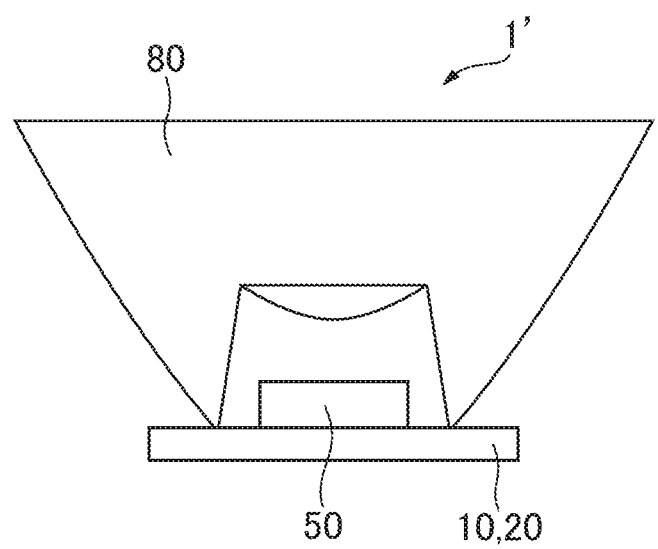
FIG. 3 is a side view of a light-emitting device 1' with a lens 80 attached thereto.

FIG. 3 is a side view of a light-emitting device 1' with a lens 80 attached thereto. When the light-emitting device 1 is used as an illumination apparatus, it is provided with, as illustrated in FIG. 3, the lens 80 mounted on the upper surface of the circuit board 20 so as to cover, for example, the seal resin 50. The lens 80 is an example of the optical element, which condenses light emitted from the plurality of LED elements 30 in the light-emitting device 1 and emits the light in an upward direction from the light-emitting device 1'. In order to facilitate mounting the lens 80, the area of the region not covered with the seal resin 50 on the circuit board 20 may be widened to secure a flat region that is surmounted by the lens 80. Since the light-emitting device 1 allows a plurality of LED elements 30 that is mounted densely, thereby enabling narrowing an emission region (emission area) without decreasing the number of the elements, it can achieve effective injection of the emitted light from the LED elements 30 into the lens 80.

Depending on applications of the light-emitting device 1, an optical element other than the lens 80, such as a filter, may be mounted on the circuit board 20. For example, a plate-like optical element instead of the lens 80 may be used, so that light from the LED elements 30 in the light-emitting device 1 is emitted therethrough.

Figure 4:
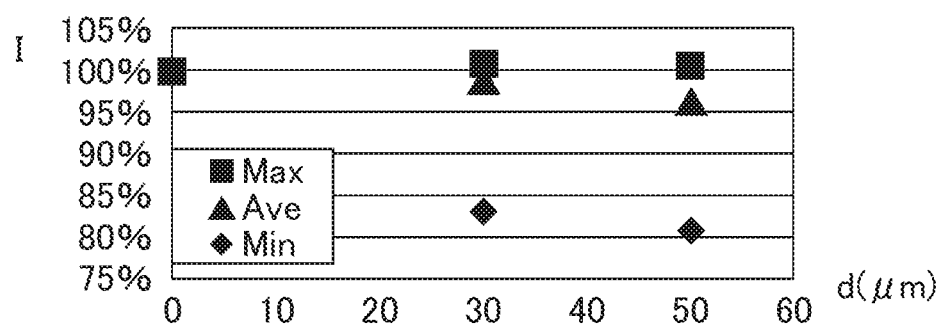
FIG. 4 is a graph indicating a relation between the mount space among the LED elements 30 and the illuminance of the light-emitting device 1'.

FIG. 4 is a graph indicating a relation between the mount space among the LED elements 30 and the illuminance of the light-emitting device 1'. The horizontal axis of the graph is a mount space d (µm) among the LED elements 30, and the vertical axis is a relative illuminance I with respect to the illuminance of emitted light from the light-emitting device 1' when the mount space d is 0 mm. Each LED element 30 is of a rectangular shape of 1 mm square and the incident edge of the lens 80 is of a circular shape of 10 mm in diameter. FIG. 4 indicates maximum values (Max), average values (Ave), and minimum values (Min) of the relative intensity I of the emitted light through the lens 80, when the mount space d is 30 µm and 50 µm. As indicated in FIG. 4, the minimum values of the relative intensity I for the mount spaces d of 30 µm and 50 µm are about 20% lower than that for the mount space d of 0 µm owing to a variation caused by the incorporation of the lens 80. However, the maximum values of the relative intensity I and the average values thereof are almost constant regardless of the mount spaces d in the illustrated range.

A narrower mount space d among the LED elements 30 is preferable because it leads to a smaller emission point for condensing light by using the lens 80. However, the mount space d is desirably secured so as to be, for example, at least about 5 μm so that no short occurs across adjacent LED elements 30. Further, a too large mount space d causes a larger emission diameter of the plurality of LED elements 30 relative to the diameter of the incident edge of the lens 80, leading to light loss, which results in the decrease of the illuminance of light emitted from the light-emitting device 1'. For example, when the lens 80 used for the measurement illustrated in FIG. 4 is used, the upper limit of the mount space d is preferably about 50 μm.

Still further, a too large mount space d causes the variation of the hue of the emitted light, owing to the phosphor 51 invading the inter-element regions 60, as described above. The mount space between adjacent LED elements 30 may not be necessarily narrower than the particle size of the phosphor, and may be a length of 120% or less of the average particle size of the phosphor. In the present description, densely mounting the LED elements 30 means that the mount space between adjacent LED elements 30 is set at 5 μm or more and 120% or less of the median diameter D50 of the phosphor (a phosphor having the largest average particle size, when a plurality of different phosphors is used). In actual fact, in the case where a phosphor having an average particle size (median diameter D50) of 25 μm, for example, is used in the light-emitting device 1, it is confirmed that the variation of the hue of the emitted light is not substantially caused, as long as the mount space between the LED elements 30 is not more than 30 μm, which corresponds to 120% of the average particle size of the particles of the phosphor.

FIG. 5(A) to FIG. 8(C) are top views and cross-sectional views depicting manufacturing steps of the light-emitting device 1. FIG. 5(B), FIG. 5(C), FIG. 6(B), FIG. 6(C), FIG. 7(B), FIG. 7(C), FIG. 8(B), and FIG. 8(C) depict cross-sections along the line VB-VB and the line VC-VC in FIG. 5(A), the line VIB-VIB and the line VIC-VIC in FIG. 6(A), the line VIIB-VIIB and the line VIIC-VIIC in FIG. 7(A), and the line VIIIB-VIIIB and the line VIIIC-VIIIC in FIG. 8(A), respectively.

When the light-emitting device 1 is manufactured, first, the mount board 10 and the circuit board 20 provided with the opening 21 are superimposed and bonded to each other, as depicted in FIG. 5(A) to FIG. 5(C). Then, the plurality of LED elements 30 is mounted on the upper surface of the mount board 10 exposed within the opening 21 of the circuit board 20, as depicted in FIG. 6(A) to FIG. 6(C), so that the light-emitting surfaces thereof face opposite to the mount board 10. At that time, the space between adjacent LED elements 30 is set at a length of 5 μm or more and 120% or less of the median diameter D50 of the phosphor that is used (a phosphor having the largest average particle size, when a plurality of different phosphors is used). Further, at the same time, the Zener diode 70 is also mounted between the conductive patterns 22A and 22B on the upper surface of the circuit board 20.

Then, adjacent LED elements 30 are connected electrically to each other with wires 31, and wires 31 led out of outermost LED elements 30 adjacent to the perimeter of the opening 21 are connected to the conductive patterns 22A and 22B, as depicted in FIG. 7(A) to FIG. 7(C). At the same time, the Zener diode 70 is also connected to the conductive patterns 22A and 22B with wires 71.

Then, the resin frame 40 is fixed to a region on the upper surface of the circuit board 20, the region neighboring and enclosing the perimeter of the opening 21, as depicted in FIG. 8(A) to FIG. 8(C). Then, all of the LED elements 30 are sealed with the seal resin 50 containing a phosphor. At that time, while the seal resin 50 is kept uncured, the phosphor is allowed to naturally settle out in the seal resin 50 so as to be deposited on the upper surfaces of the LED elements 30; and thereafter, the seal resin 50 is cured. The light-emitting device 1 illustrated in FIG. 1(A) to FIG. 1(C) is thus completed according to the above steps.

Figure 9:
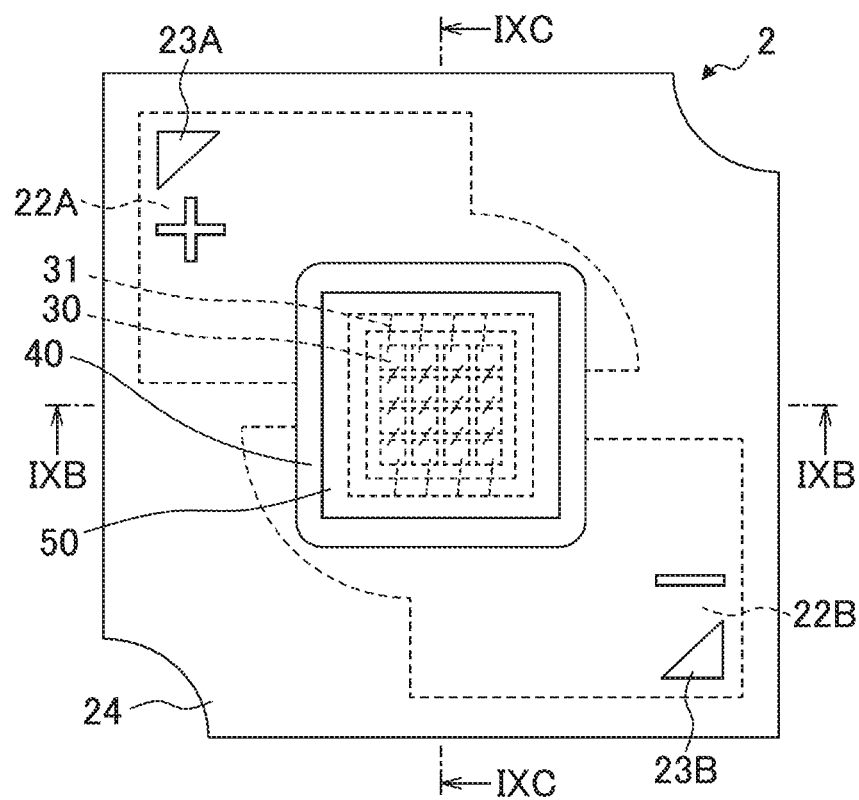
FIGS. 9(A) to (C) are a top view and cross-sectional views of a light-emitting device 2.
Figure 9:
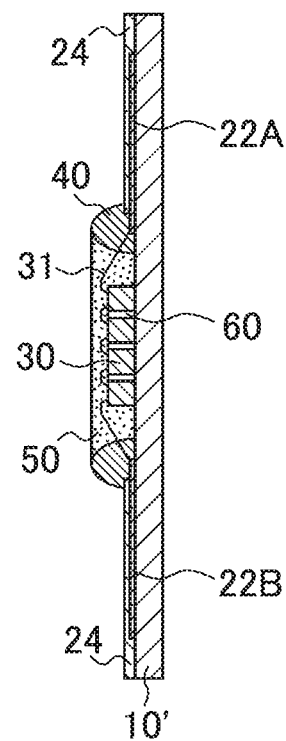
Figure 9:
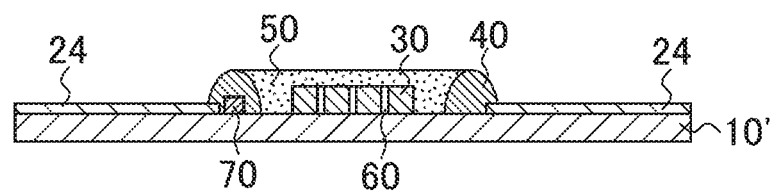

FIG. 9(A) to FIG. 9(C) are a top view and cross-sectional views of a light-emitting device 2. FIG. 9(A) is a top view of the light-emitting device 2 as a completed product, FIG. 9(B) is a cross-sectional view along the line IXB-IXB in FIG. 9(A), and FIG. 9(C) is a cross-sectional view along the line IXC-IXC in FIG. 9(A). The light-emitting device 2 is provided with a mount board 10', LED elements 30, a resin frame 40, a seal resin 50, and a Zener diode 70 as major components. The light-emitting device 2 is different from the light-emitting device 1 in that it is not provided with the circuit board 20 which has an opening 21 and is included in the light-emitting device 1.

Figure 10:
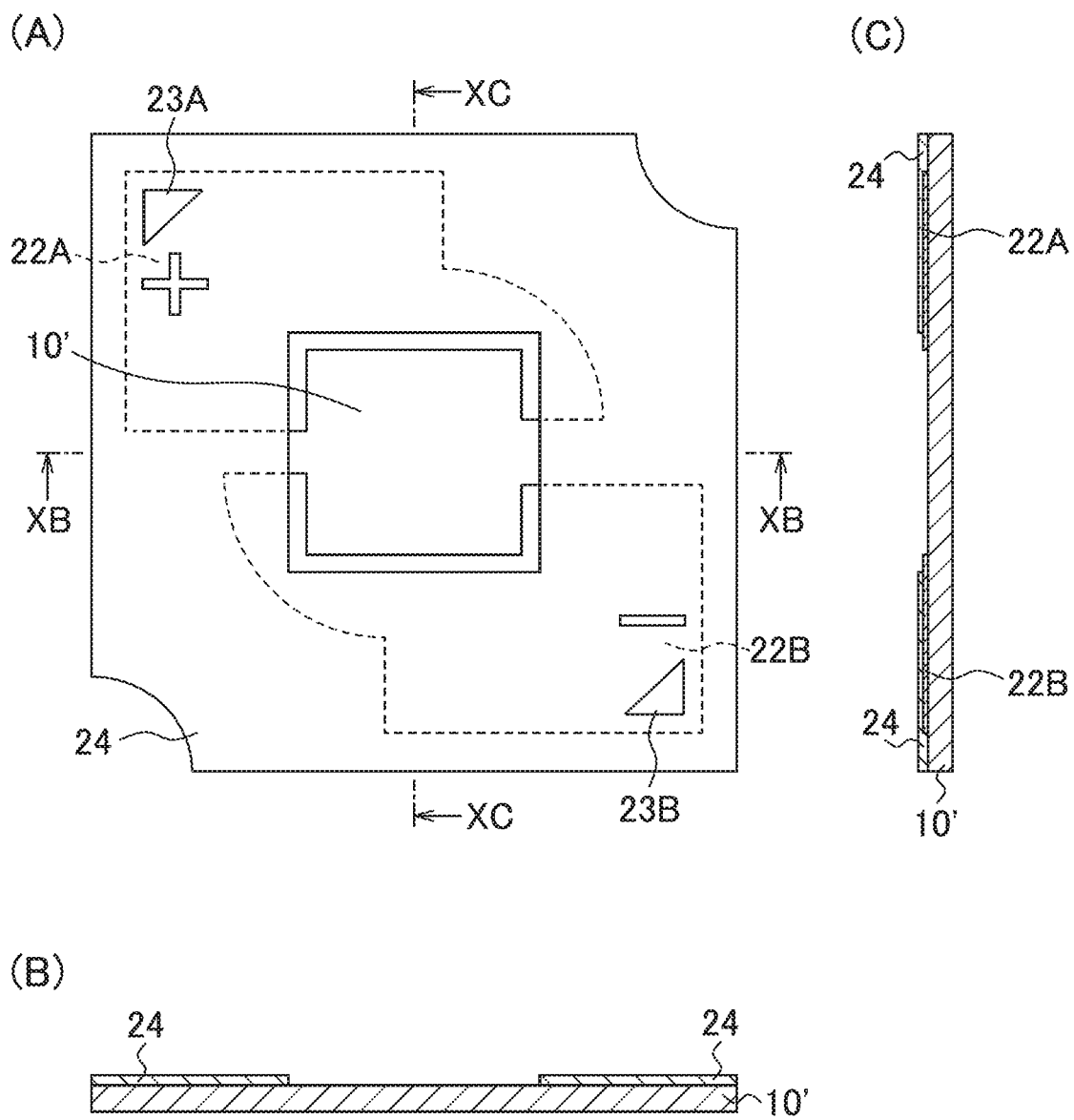
FIGS. 10(A) to (C) are a top view and cross-sectional views depicting a manufacturing step of the light-emitting device 2.
Figure 11:
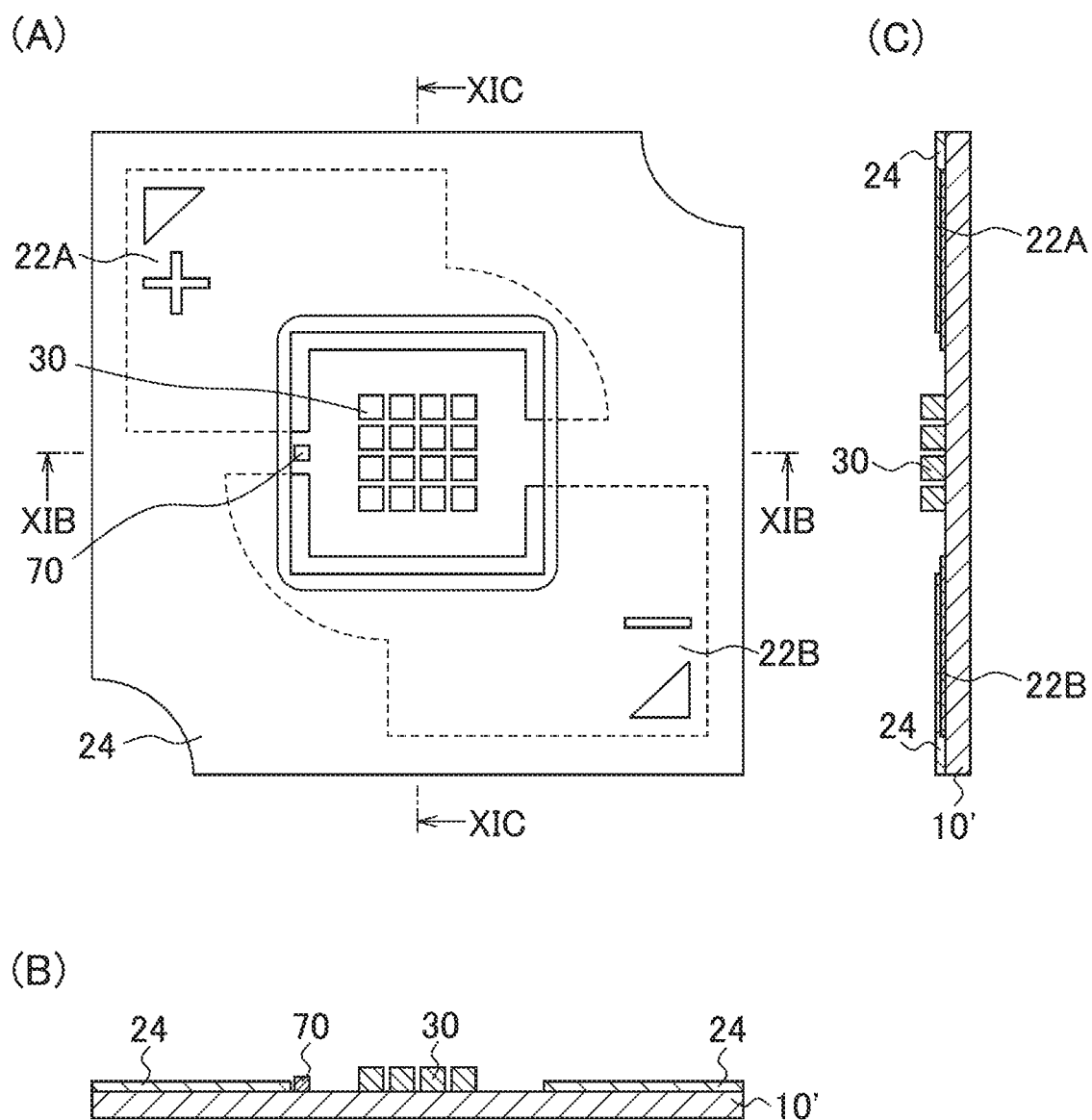
FIGS. 11(A) to (C) are a top view and cross-sectional views depicting a manufacturing step of the light-emitting device 2.

The mount board 10' is, for example, an electrically insulative board composed of ceramic, and includes, in the central region of the upper surface thereof, a mount region on which the LED elements 30 are mounted. The light-emitting device 2 is also provided with a plurality of LED elements 30 mounted in a lattice-like arrangement in the central region of the mount board 10', as is the case with the light-emitting device 1. The mount board 10', as is the case with the circuit board 20 of the light-emitting device 1, is provided with a conductive pattern 22A for a '+' electrode and a conductive pattern 22B for a '−' electrode, which are formed on the upper surface thereof, and connection electrodes 23A and 23B which are formed at two corners located diagonally on the upper surface thereof. Further, the mount board 10' is provided with a white resist 24 which is formed on the upper surface thereof and covers the conductive patterns 22A and 22B except for the region on the surface neighboring and enclosing the perimeter of the mount region for the LED elements 30 and the regions on the connection electrodes 23A and 23B (see FIG. 10(A) described later).

The resin frame 40 is an almost rectangular frame body composed of, for example, a white resin and fitted to the size of the mount region of the mount board 10', as is the case with the light-emitting device 1. However, the resin frame 40 may be of another shape such as a circular shape. The seal resin 50 is injected into a region enclosed by the resin frame 40 on the mount board 10', to cover and protect (seal) all of the LED elements 30 together. The seal resin 50 is a thermally resistive resin, such as a silicone resin, in which a phosphor is mixed and dispersed, as is the case with the light-emitting device 1.

Figure 12:
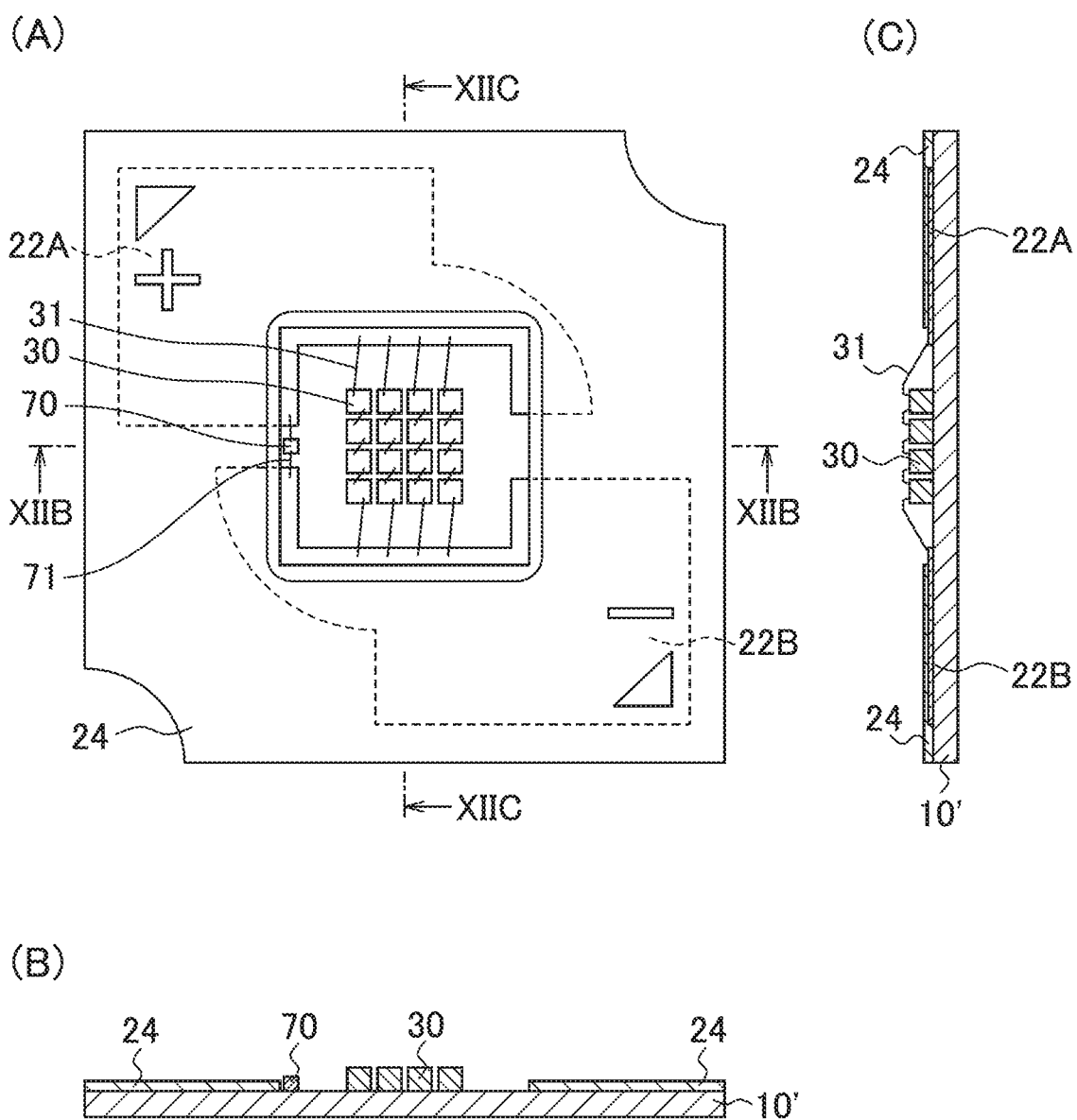
FIGS. 12(A) to (C) are a top view and cross-sectional views depicting a manufacturing step of the light-emitting device 2.
Figure 13:
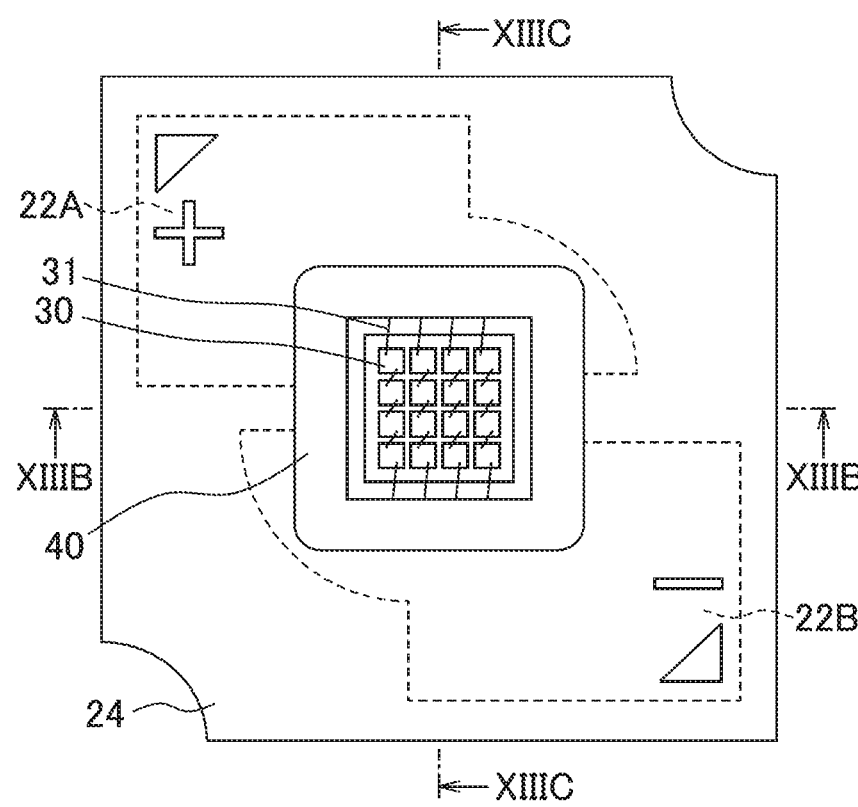
FIGS. 13(A) to (C) are a top view and cross-sectional views depicting a manufacturing step of the light-emitting device 2.
Figure 13:
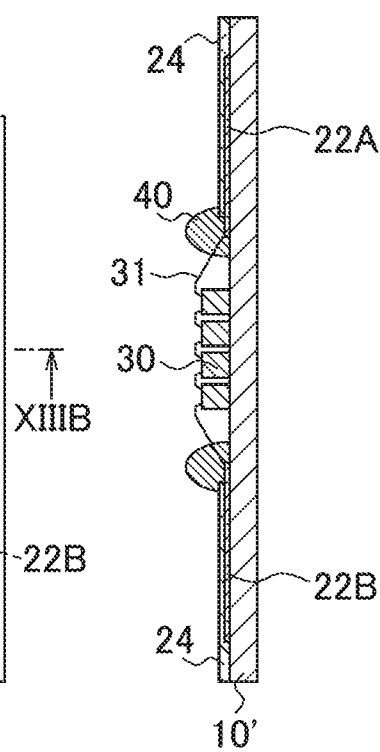
Figure 13:
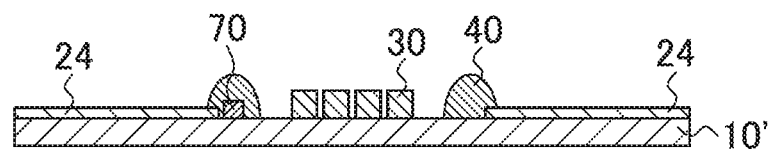

The Zener diode 70 is connected to the conductive patterns 22A and 22B in parallel with the LED elements 30 on the mount board 10' (see FIG. 12(A) described later), and protects the LED elements 30 by bypassing electrical current caused by voltage inversely applied to the LED elements 30.

Also in the light-emitting device 2, the plurality of LED elements 30 is mounted densely on the mount board 10 so that the space between adjacent LED elements 30 has a length of 5 μm or more and 120% or less of the median diameter D50 of the phosphor (a phosphor having the largest average particle size, when a plurality of different phosphors is used). Thus, since the phosphor in the seal resin 50 does not substantially invade the inter-element regions 60, the distance in the phosphor layer which is traveled by emitted light is kept constant regardless of the position and direction of emission from the LED elements 30. Therefore, the light-emitting device 2 is also unlikely to cause a deviation of the actual hue of the emitted light from a desired hue thereof, and thereby resulting in emitted light with uniform chromaticity.

Also in the light-emitting device 2, a large number of particles of the phosphor 51 may invade the peripheral region between the resin frame 40 and the outermost LED elements 30, unlike the inter-element regions 60, as long as the phosphor is settled and placed in such a way that the thickness of the phosphor in the peripheral region is comparable to that on the upper side of the LED elements 30. However, it is preferable that the width of this peripheral region be narrower than the width of each LED element 30. Alternatively, this peripheral region may be completely filled with a transparent or white resin.

The light-emitting device 2, as is the case with the light-emitting device 1', may be provided with an optical element such as a lens 80 mounted on the upper surface of the mount board 10' so as to cover the seal resin 50.

FIG. 10(A) to FIG. 13(C) are top views and cross-sectional views depicting manufacturing steps of the light-emitting device 2. FIG. 10(B), FIG. 10(C), FIG. 11(B), FIG. 11(C), FIG. 12(B), FIG. 12(C), FIG. 13(B), and FIG. 13(C) depict cross-sections along the line XB-XB and the line XC-XC in FIG. 10(A), the line XIB-XIB and the line XIC-XIC in FIG. 11(A), the line XIIB-XIIB and the line XIIC-XIIC in FIG. 12(A), and the line XIIIB-XIIIB and the line XIIIC-XIIIC in FIG. 13(A), respectively.

When the light-emitting device 2 is manufactured, first, the mount board 10' is prepared which is provided with the conductive patterns 22A and 22B, the connection electrodes 23A and 23B, and the white resist 24 formed thereon, as depicted in FIG. 10(A) to FIG. 10(C). Then, the plurality of LED elements 30 is mounted in the central region of the mount board 10', as depicted in FIG. 11(A) to FIG. 11(C), so that the light-emitting surfaces thereof face opposite to the mount board 10. At that time, the space between adjacent LED elements 30 is set at a length of 5 µm or more and 120% or less of the median diameter D50 of the phosphor that is used (a phosphor having the largest average particle size, when a plurality of different phosphors is used). Further, at the same time, the Zener diode 70 is also mounted between the conductive pattern 22A and the conductive pattern 22B on the upper surface of the mount board 10'.

Then, adjacent LED elements 30 are connected electrically to each other with wires 31, and wires 31 led out of outermost LED elements 30 adjacent to the perimeter of the mount region are connected to the conductive patterns 22A and 22B, as depicted in FIG. 12(A) to FIG. 12(C). At the same time, the Zener diode 70 is also connected to the conductive patterns 22A and 22B with wires 71.

Then, the resin frame 40 is fixed to the peripheral part of the mount region on the mount board 10', as depicted in FIG. 13(A) to FIG. 13(C). Then, all of the LED elements 30 are sealed with the seal resin 50 containing a phosphor. At that time, while the seal resin 50 is kept uncured, the phosphor is allowed to naturally settle out in the seal resin 50 so as to be deposited on the upper surfaces of the LED elements 30; and thereafter, the seal resin 50 is cured. The light-emitting device 2 illustrated in FIG. 9(A) to FIG. 9(C) is thus completed according to the above steps.

The LED elements 30 are mounted by using wire bonding in the light-emitting devices 1 and 2, but the above configuration is also applicable to a light-emitting device in which LED elements are mounted by using flip chip. In other words, the space among the plurality of LED elements mounted densely on the mount board by using flip chip may have a length of 120% or less of the median diameter D50 of the phosphor that is used (a phosphor having the largest average particle size, when a plurality of different phosphors is used). Then, a deviation of the actual hue of emitted light from a desired hue thereof is unlikely to occur, owing to substantially preventing the phosphor in the seal resin from invading the space among the elements, resulting in emitted light with uniform chromaticity, as is the case with the light-emitting devices 1 and 2.

The invention claimed is:

1. A light-emitting device comprising:
a board;
a plurality of light-emitting elements mounted densely in a rectangular mount region on the board in a lattice-like arrangement so that light-emitting surfaces thereof face opposite to the board;
a rectangular resin frame formed from a white resin around the mount region, wherein the board comprises a flat region surrounding the rectangular resin frame;
a seal resin containing a plurality of different phosphors and injected into a region enclosed by the resin frame on the board to cover all of the plurality of light-emitting elements, wherein the plurality of different phosphors is excited by light from the plurality of light-emitting elements and deposited on upper surfaces of the plurality of light-emitting elements, wherein
a space between adjacent light-emitting elements has a length of 5 µm or more and 120% or less of a median diameter D50 of a phosphor which has the largest average particle size of the plurality of different phosphors,
the upper end of the space between adjacent light-emitting elements is blocked and clogged with large particles of the plurality of different phosphors, and substantially no phosphor invades the space between adjacent light-emitting elements; and
a lens configured to condense light emitted from the plurality of light-emitting elements, the lens comprising a lower concave recessed from a bottom surface of the lens, the lens being mounted on the board with the bottom of the lens in contact with the flat region of the board surrounding the resin frame and the seal resin placed within the lower concave, wherein there is a gap between the lens and the seal resin in the lower concave.

2. The light-emitting device according to claim 1, wherein the median diameter D50 is 20 µm or more and 25 µm or less.

3. A manufacturing method of a light-emitting device, comprising the steps of:
mounting a plurality of light-emitting elements densely in a rectangular mount region on a board in a lattice-like arrangement so that light-emitting surfaces thereof face opposite to the board;
forming a rectangular resin frame from a white resin around the mount region;
injecting a seal resin into a region enclosed by the resin frame on the board to seal all of the plurality of light-emitting elements, the seal resin containing a plurality of different phosphors excited by light from the plurality of light-emitting elements;
causing the plurality of different phosphors to naturally settle out in the seal resin and to be deposited on upper surfaces of the plurality of light-emitting elements, thereby causing the upper end of the space between adjacent light emitting elements to be blocked and clogged with large particles of the plurality of different phosphors, so that substantially no phosphor invades the space between adjacent light-emitted elements; and mounting a lens on the board, the lens having a lower concave recessed from a bottom surface of the lens, wherein mounting the lens includes placing the seal resin in the lower concave and mounting the bottom of the lens in contact with a flat region of the board surrounding the resin frame, wherein the lens is configured to condense light emitted from the plurality of light-emitting elements, wherein there is a gap between the lens and the seal resin in the lower concave wherein in the step of mounting, the plurality of light-emitting elements is mounted so that a space between adjacent light-emitting elements has a length of 5 μm or more and 120% or less of a median diameter D50 of a phosphor which has the largest average particle size of the plurality of different phosphors.

4. The light-emitting device according to claim 1, wherein bubbles remain in the space between adjacent light-emitting elements.

5. The light-emitting device according to claim 1, wherein the space between adjacent light-emitting elements is filled with the seal resin.

6. The light-emitting device according to claim 1, wherein the board is composed of a metal mount board and a circuit board fixed on the mount board, the circuit board having a rectangular opening, and the plurality of light-emitting elements are mounted on an upper surface of the mount board exposed in the opening.

7. The light-emitting device according to claim 6, wherein the mount board has a peripheral region between the inner wall of the opening and outermost light-emitting elements, the peripheral region having a width smaller than the width of each of the light-emitting elements.

8. The light-emitting device according to claim 1, wherein the board is an electrically insulative board composed of ceramic, and has a peripheral region between the resin frame and outermost light-emitting elements, the peripheral region having a width smaller than the width of each of the light-emitting elements.

9. The light-emitting device according to claim 8, wherein the peripheral region is filled with a white resin.

10. The light-emitting device according to claim 1, wherein the board is substantially formed into a square.

* * * * *